US012538415B2

(12) United States Patent
Wang

(10) Patent No.: US 12,538,415 B2
(45) Date of Patent: Jan. 27, 2026

(54) FLEXIBLE CIRCUIT BOARD AND METHOD FOR FABRICATING THE SAME

(71) Applicants: HongQiSheng Precision Electronics (QinHuangdao) Co., Ltd., Hebei Province (CN); Avary Holding (Shenzhen) Co., Ltd., Shenzhen (CN); Garuda Technology Co., Ltd., New Taipei (CN)

(72) Inventor: Chao Wang, Hebei Province (CN)

(73) Assignees: HONGQISHENG PRECISION ELECTRONICS (QINHUANGDAO) CO., LTD., Hebei Province (CN); AVARY HOLDING (SHENZHEN) CO., LTD., Shenzhen (CN); GARUDA TECHNOLOGY CO., LTD., New Taipei (TW)

( * ) Notice: Subject to any disclaimer, the term of this patent is extended or adjusted under 35 U.S.C. 154(b) by 288 days.

(21) Appl. No.: 18/457,924

(22) Filed: Aug. 29, 2023

(65) Prior Publication Data
US 2025/0056715 A1 Feb. 13, 2025

(30) Foreign Application Priority Data
Aug. 11, 2023 (CN) .......................... 202311013101.8

(51) Int. Cl.
H05K 1/02 (2006.01)
H05K 3/10 (2006.01)
(Continued)

(52) U.S. Cl.
CPC ............. *H05K 1/028* (2013.01); *H05K 3/103* (2013.01); *H05K 3/3457* (2013.01);
(Continued)

(58) Field of Classification Search
CPC .......... H05K 2201/09036; H05K 2201/09081; H05K 2201/09163; H05K 2201/0919
See application file for complete search history.

(56) References Cited

U.S. PATENT DOCUMENTS 6,208,521 B1 * 3/2001 Nakatsuka ............. H10D 99/00
174/268
2018/0110129 A1 * 4/2018 Kieslinger ........... H05K 1/0269
(Continued)

FOREIGN PATENT DOCUMENTS

| CN | 112203393 A | 1/2021 |
|----|-------------|--------|
| TW | 200841815 A | 10/2008 |
| TW | 202142073 A | 11/2021 |

*Primary Examiner* — Timothy J Thompson
*Assistant Examiner* — John B Freal
(74) *Attorney, Agent, or Firm* — MUNCY, GEISSLER, OLDS & LOWE, P.C.

(57) ABSTRACT

A flexible circuit board and a method for fabricating the same are provided. The flexible circuit board includes an insulation substrate with two trenches on its two opposite end surfaces separately. A signal wire is disposed in the insulation substrate, and thus the insulation substrate surrounds the signal wire. Two flexible circuit substrates are separately located on two opposite surfaces of the insulation substrate, and each flexible circuit substrate includes a conductive layer and a power layer. The conductive layer is extended from one surface to end surfaces of the insulation substrate, and then is extended to the trenches along the end surfaces. The power layer is located between the conductive layer and the insulation substrate and is electrically connected to the conductive layer. In each trench, one conductive layer is connected to the other conductive layer, and two conductive layers are electrically connected to each other.

15 Claims, 7 Drawing Sheets

(51) Int. Cl.
H05K 3/34 (2006.01)
H05K 3/46 (2006.01)
(52) U.S. Cl.
CPC ... *H05K 3/4644* (2013.01); *H05K 2201/0141* (2013.01); *H05K 2201/05* (2013.01)

(56) References Cited

U.S. PATENT DOCUMENTS

| | | | | |
|---|---|---|---|---|
| 2021/0341662 A1* | 11/2021 | Zhang | ................. | G02F 1/13458 |
| 2023/0025696 A1 | 1/2023 | Liao | | |

* cited by examiner

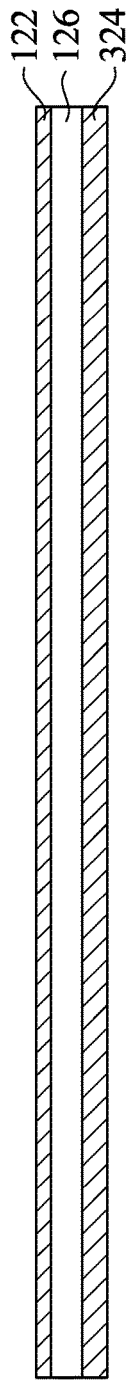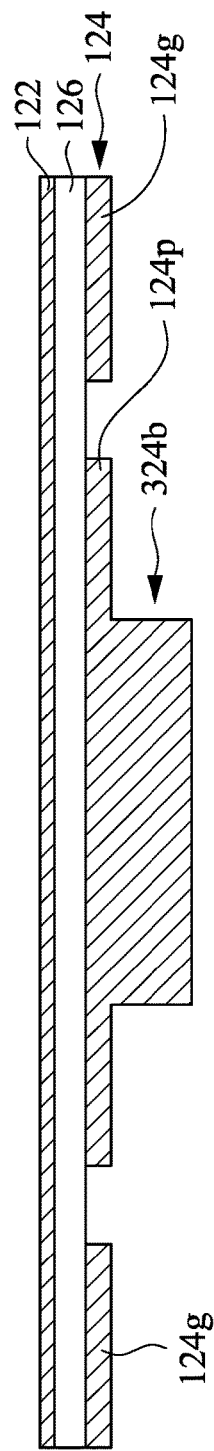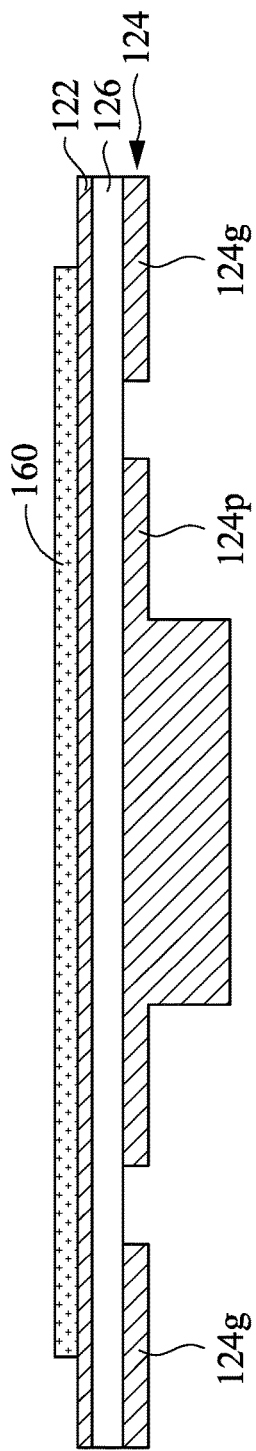

FLEXIBLE CIRCUIT BOARD AND METHOD FOR FABRICATING THE SAME

RELATED APPLICATIONS

This application claims priority to China Application Serial Number 202311013101.8, filed Aug. 11, 2023, which is herein incorporated by reference in its entirety.

BACKGROUND

Technical Field

The present disclosure relates to a flexible circuit board. More particular, the present disclosure relates to the flexible circuit board applied to high frequency transmission and the method for fabrication of the same.

Description of Related Art

In present, wireless communication has been developed rapidly, and the requirements for transmission speed and terminal network density are gradually increasing. Accordingly, wireless communication antenna technology of Multiple-Input Multiple-Output (MIMO) has been developed. Although present electromagnetic shielding technology can fulfill the usage of transmission signals in a specific frequency range, the antennas and transmission wires are increasingly affected by external signals as the demand for high-frequency transmission increases. For example, the antennas and transmission wires are prone to be affected when the signal frequency exceeds 50 GHz.

On the other hand, the primary method for electromagnetic shielding of transmission wires or antennas is to dispose conductive vias between the circuit layers of the transmission wires, and the signals are shielded through these conductive vias. However, the method of disposing conductive vias limits not only the effect of electromagnetic shielding from high frequency signals but also the layout of circuit layers in the transmission wires.

SUMMARY

Accordingly, the disclosure is to provide a flexible circuit board and the method for fabrication of the same, thereby increasing the electromagnetic shielding effect of high frequency signal.

At least one embodiment of the disclosure provides a flexible circuit board including an insulation substrate, and each of two opposite end surfaces of the insulation substrate has a trench. A signal wire is disposed in the insulation substrate, and the insulation substrate surrounds the signal wire. Two flexible circuit substrates are separately located on two opposite surfaces of the insulation substrate. Each of the flexible circuit substrates includes a conductive layer and a power layer. The conductive layer extends from one of the surfaces toward the end surfaces of the insulation substrate, and then extends into the trenches along the end surfaces of the insulation substrate. The power layer is located between the conductive layer and the insulation substrate and is electrically connected to the conductive layer. One of the conductive layers is connected to the other one of the conductive layers within the trenches, and the conductive layers are electrically connected to each other.

At least in one embodiment of the disclosure, the flexible circuit board further includes two conductive structures disposing inside the trenches separately, and one of the conductive layers is connected to the other one of the conductive layers through the conductive structures.

At least in one embodiment of the disclosure, each of the conductive structures includes a ground end and two soldering materials. The soldering materials are located on two opposite sides of the ground end separately. The conductive layers are electrically connected to the ground end separately through the soldering materials, and the power layers are electrically connected to the ground end separately through the soldering materials.

At least in one embodiment of the disclosure, each of the conductive structures includes two metal materials located on the two opposite sides of the ground end separately and located on a bottom surface of the trench. The conductive layers are electrically connected to the ground ends through the soldering materials and the metal materials.

At least in one embodiment of the disclosure, each of the power layers includes two ground wires and a power supply wire. Each of the ground wires is partially located into one of the trenches and is connected to one of the conductive structures separately. The power supply wire is located between the ground wires and is electrically connected to the ground wires.

At least in one embodiment of the disclosure, each of the flexible circuit substrates further includes an insulation layer. The conductive layer and the one of the power layers are located on two opposite sides of the insulation layer separately, and a thickness of the one of the power layers is larger than a thickness of the conductive layer.

At least in one embodiment of the disclosure, the insulation substrate includes liquid crystal polymers.

At least in one embodiment of the disclosure, the flexible circuit board further includes a covering layer disposed on the conductive layers of the flexible circuit substrates and surrounding the insulation substrate and the flexible circuit substrates.

At least in one embodiment of the disclosure, the flexible circuit board further includes two adhesive layers separately located between the flexible circuit substrates and the insulation substrate.

At least one embodiment of the disclosure provides a method for fabricating a flexible circuit board. The method includes providing a substrate with a signal wire and two ground ends, and the signal wire is located between the ground ends. A part of the substrate is removed to form a trench on each of two opposite end surfaces of the substrate and to partially expose the ground ends. Two first boundaries are located between one of the trenches and one of the end surfaces. Two flexible circuit substrates are provided, and each of the flexible circuit substrates includes a conductive layer and a power layer electrically connected to each other. The flexible circuit substrates are disposed on two opposite surfaces of the substrate separately after the part of the substrate is removed, and one of the power layers is located between one of the conductive layers and the substrate. Two second boundaries are located between the surfaces of the substrate and one of the end surfaces. Two opposite ends of one of the flexible circuit substrates are bent separately along the second boundaries and along the first boundaries after the flexible circuit substrates are disposed on the substrate. Thus, one of the conductive layers is connected to the other one of the conductive layers within the trenches, and the conductive layers are electrically connected to each other.

At least in one embodiment of the disclosure, providing the substrate includes providing an initial substrate including an insulation layer and a metal layer located on two opposite sides of the initial substrate separately. Two metal materials are formed on each of the opposite sides of the initial substrate separately. The metal layer is patterned to form the single wire and the ground ends spaced from each other, and each of the metal materials is separately located on and electrically connected to the ground ends. Each of two insulation materials is separately disposed on the insulation layer and on the signal wire to form the substrate after the ground ends and the signal wire are formed. The insulation layer, the ground ends and the signal wire are located between the two insulation materials, and the insulation materials cover the signal wire and the ground ends.

At least in one embodiment of the disclosure, providing one of the flexible circuit substrates includes providing an initial flexible circuit substrate including one of the conductive layers and a metal layer. A thickness of the one of the conductive layers is less than a thickness of the metal layer. A metal bulk is formed on the one of the conductive layers. The one of the conductive layers is patterned to form the flexible circuit substrate including the one of the power layers. The one of the power layers includes a power supply wire and two ground wires, and the power supply wire is located between the two ground wires, and the metal bulk is located on the power supply wire.

At least in one embodiment of the disclosure, the method further includes removing another part of the substrate to form a depressed region on each of the surfaces of the substrate separately. The metal bulk of one of the flexible circuit substrates is disposed on the substrate and in alignment with the depressed region.

At least in one embodiment of the disclosure, providing the one of the flexible circuit substrates further includes adhering a covering layer on the conductive layers after the metal layer is patterned. The covering layer covers the power supply wire and a part of the ground wires.

At least in one embodiment of the disclosure, the method further includes disposing two adhesive layers on two of the power layers separately before the flexible circuit substrates are disposed on the substrate. The adhesive layers cover two surfaces of the power layers.

According to the aforementioned embodiments, the flexible circuit substrates extend along the surfaces and the end surfaces of the insulation substrate and extend into the trenches which are located on the end surfaces of the insulation substrate. Thus, the conductive layers of the flexible circuit substrate are connected to each other within the trenches. Therefore, the conductive layers surround outside the insulation substrate, so that the full-shielding electromagnetic shielding layer is formed, thereby improving the effect of electromagnetic shielding.

BRIEF DESCRIPTION OF THE DRAWINGS

To illustrate more clearly the aforementioned and the other features, merits, and embodiments of the present disclosure, the description of the accompanying figures are as follows:

FIG. 3A to FIG. 3C illustrate cross-sectional views of a method for fabricating a flexible circuit board in accordance with one embodiment of the present disclosure.

DETAILED DESCRIPTION

Figure 1:
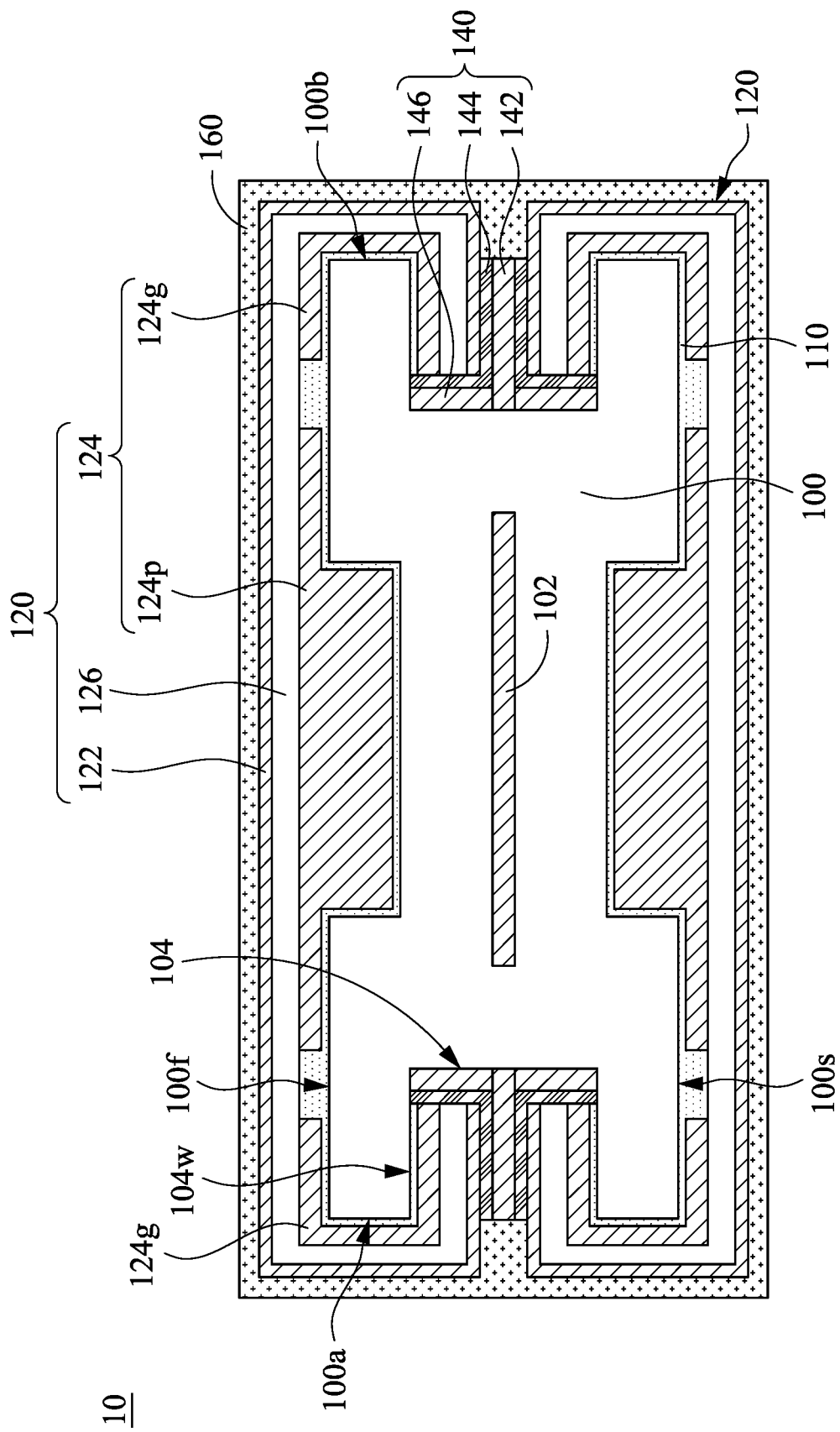
FIG. 1 illustrates a cross-sectional view of a flexible circuit board in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, the dimensions (such as lengths, widths and thicknesses) of components (such as layers, films, substrates and regions) in the drawings are enlarged not-to-scale, and the number of components may be reduced in order to clarify the technical features of the disclosure. Therefore, the following illustrations and explanations are not limited to the number of components, the number of components, the dimensions and the shapes of components, and the deviation of size and shape caused by the practical procedures or tolerances are included. For example, a flat surface shown in drawings may have rough and/or non-linear features, while angles shown in drawings may be circular. As a result, the drawings of components shown in the disclosure are mainly for illustration and not intended to accurately depict the real shapes of the components, nor are intended to limit the scope of the claimed content of the disclosure.

Further, when a number or a range of numbers is described with "about," "approximate," "substantially," and the like, the term is intended to encompass numbers that are within a reasonable range considering variations that inherently arise during manufacturing as understood by one of ordinary skill in the art. In addition, the number or range of numbers encompasses a reasonable range including the number described, such as within +/−30%, +/−20%, +/−10% or +/−5% of the number described, based on known manufacturing tolerances associated with manufacturing a feature having a characteristic associated with the number. The words of deviations such as "about," "approximate," "substantially," and the like are chosen in accordance with the optical properties, etching properties, mechanical properties or other properties. The words of deviations used in the optical properties, etching properties, mechanical properties or other properties are not chosen with a single standard.

A flexible circuit board is disclosed. Referring to FIG. 1, the flexible circuit board 10 includes the insulation substrate 100, the signal wire 102 and two flexible circuit substrates 120. The signal wire 102 is disposed in the insulation substrate 100, while the insulation substrate 100 surrounds the signal wire 102. The flexible circuit substrates 120 are separately located on two surfaces of the insulation substrate 100 which are opposite to each other. Specifically, one of the flexible circuit substrates 120 is located on the surface 100f of the insulation substrate 100, while the other one of the flexible circuit substrates 120 is located on the surface 100s of the insulation substrate 100. In the embodiment, the insulation substrate 100 may include materials with higher thermal plasticity, such as liquid crystal polymers (LCPs), polytetrafluoroethylene (PTFE), polyetheretherketone (PEEK) or similarity thereof. Furthermore, these materials are beneficial for high frequency signal to transmit within the flexible circuit board 10 due to their low dielectric constant and low loss factor.

It is worth mentioning, since the insulation substrate 100 fully surrounds the periphery of the signal wire 102, the signal wire 102 is spaced from the flexible circuit substrates 120. As shown in FIG. 1, each of the end surface 100a and the end surface 100b opposite to each other has one trench 104. In addition, each of the flexible circuit substrates 120 includes one conductive layer 122. The conductive layer 122 of the flexible circuit substrate 120 located on the surface 100f extends from the surface 100f of the insulation substrate 100 toward the end surface 100a and the end surface 100b and further extends into two trenches 104 along the end surface 100a and the end surface 100b. The conductive layer 122 of the flexible circuit substrate 120 located on the surface 100s extends from the surface 100s of the insulation substrate 100 toward the end surface 100a and the end surface 100b and further extends into two trenches 104 along the end surface 100a and the end surface 100b.

Specifically, two opposite sides of each conductive layer 122 extend from one surface of the insulation substrate 100 (i.e. the surface 100f or the surface 100s) toward the end surface 100a and the end surface 100b separately and extend along the end surface 100a and the end surface 100b separately into the side walls 104w of the trenches 104.

One conductive layer 122 is connected to the other conductive layer 122 within the trenches 104, and these two conductive layers 122 are electrically connected to each other. In other words, the connected regions of two conductive layers 122 are located within two trenches 104. Since two conductive layers 122 are electrically connected to each other, an electromagnetic shielding layer enclosing the insulation substrate 100 (and the signal wire 102) is formed. It is worth mentioning, one conductive layer 122 is not limited to directly touch the other conductive layer 122, that is, the one conductive layer 122 may be connected to (and electrically connected to) the other conductive layer 122 through other components.

Each flexible circuit substrate 120 includes one power layer 124 which is located between the conductive layer 122 and the insulation substrate 100 and is electrically connected to the conductive layer 122. In the embodiment, each flexible circuit substrate 120 further includes one insulation layer 126, and the conductive layer 122 and the power layer 124 are separately located on opposite sides of this insulation layer 126. The materials of the conductive layer 122 and the power layer 124 may include conductive materials such as copper, while the materials of the insulation layer 126 may include organic resins such as modified polyimide (MPI), fluorine polyimide or similarity thereof. It is worth mentioning, the thickness of the power layer 124 is larger than the thickness of the conductive layer 122 in this embodiment. For example, the thickness of the power layer 124 may range from 18 μm to 90 μm, while the thickness of the conductive layer 122 may range from 0.2 μm to 12 μm.

In addition, two adhesive layers 110 are located between the flexible circuit substrates 120 and the insulation substrate 100. The adhesive layers 110 are separately located on the surface 100f and the surface 100s of the insulation substrate 100 and cover the surfaces of the power layers 124. The materials of the adhesive layers 110 may include insulation adhesives such as epoxy resin or similarity thereof.

In the embodiment, the flexible circuit board 10 may further include two conductive structures 140 separately located inside the trenches 104 of the insulation substrate 100. One conductive layer 122 is connected to the other conductive layer 122 through the conductive structures 140, and two conductive layers 122 are electrically connected to each other through the conductive structures 140. For instance, referring to FIG. 1, the left end of the conductive layer 122 above is connected to the left conductive structure 140, while the left end of the conductive layer 122 below is also connected to this conductive structure 140. On the other hand, the right end of the conductive layer 122 above is connected to the right conductive structure 140, while the right end of the conductive layer 122 below is also connected to this conductive structure 140. Thus, the electromagnetic shielding layer enclosing the insulation substrate 100 (and the signal wire 102) is formed.

In the embodiment, each conductive structure 140 may further include one ground end 142 and two soldering materials 144. Two soldering materials 144 are separately located on two opposite sides of one ground end 142, and the conductive layer 122 located on two opposite sides of one conductive structure 140 are separately connected to one ground end 142 through two soldering materials 144. For instance, referring to FIG. 1, the above soldering material 144 is electrically connected to the above conductive layer 122 and the above ground end 142, while the below soldering material 144 is also electrically connected to the below conductive layer 122 and the below ground end 142 in the left conductive structure 140.

Furthermore, two power layers 124 located on two opposite sides of the conductive structure 140 are electrically connected to the ground end 142 through the soldering materials 144 separately. For example, referring to FIG. 1, the above soldering material 144 is electrically connected to the above power layer 124 and the above ground end 142, while the below soldering material 144 is electrically connected to the below power layer 124 and the below ground end 142 in the left conductive structure 140. The ground ends 142 may include conductive metal materials such as copper, and the soldering material 144 may include such solder paste, copper paste or silver paste.

It is worth mentioning, in this embodiment, each of the conductive structures 140 further include two metal materials 146 located on two opposites of the ground end 142 separately, while the ground end 142 may include copper. As shown in FIG. 1, the metal materials 146 are located on the bottom surface (not denoted) of the trenches 104, and the soldering material 144 are located between the metal materials 146 and the flexible circuit substrates 120. Furthermore, the conductive layers 122 of the flexible circuit substrates 120 may be electrically connected to the ground ends 142 through the soldering materials 144 and the metal materials 146, while the power layers 124 of the flexible circuit substrates 120 may be electrically connected to the ground ends 142 through the soldering materials 144 and the metal materials 146.

The conductive layers 122 and the power layers 124 of the flexible circuit substrates 120 are connected to the soldering materials 144 separately. Thus, the power layer 124 is electrically connected to the conductive layers 122 through the soldering materials 144 in the embodiment. However, the disclosure is not limited to this embodiment, for instance, conductive vias may be disposed in the insulation layers 126, and the conductive layers 122 are electrically connected to the power layers 124 through those conductive vias in other embodiment.

In the embodiment, one power layer 124 further includes two ground wires 124g and one power supply wire 124p. Each of the ground wires 124g is partially located into one of the trenches 104 and is connected to one of the conductive structures 140 separately. Specifically, the ground wires 124g located in the trenches 104 are electrically connected to the ground ends 142 through the soldering materials 144. On the other hand, one power supply wire 124p is located between two ground wires 124g and is electrically connected to the ground wires 124g. It is worth mentioning, in some embodiments of the disclosure, the thickness of a part of the power supply wire 124p (such as the center part of the power supply wire 124p of FIG. 1) may be larger than the thickness of other part of the power supply wire 124p, so that the current carrying capacity of the power layers 124 is increased.

The flexible circuit board 10 may further include the covering layer 160 which is disposed on the conductive layers 122 of the flexible circuit substrates 120 and surrounds the insulation substrate 100 and two flexible circuit substrates 120. In other words, the covering layer 160 covers the outer surfaces of two flexible circuit substrates 120 and encloses the flexible circuit substrates 120 and the insulation substrate 100, so that the flexible circuit substrates 120 are separated from the outside. The covering layer 160 may include insulation materials (such as resin) which are used for protecting the flexible circuit substrates 120 from affecting by outside substances and causing reaction (i.e. oxidation).

Figure 2A:
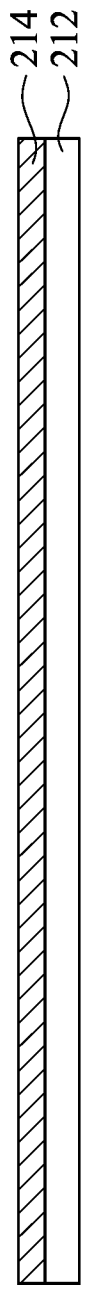
FIG. 2A to FIG. 2E illustrate cross-sectional views of a method for fabricating a flexible circuit board in accordance with one embodiment of the present disclosure.

A flexible circuit board is disclosed, and the aforementioned flexible circuit board 10 is taken as an example. The method includes sequent steps illustrated in FIG. 2A to FIG. 2E, FIG. 3A to FIG. 3C, FIG. 4 and FIG. 5. In the embodiment, firstly, the substrate 200 (denoted in FIG. 2E) is provided, and the detailed steps of providing the substrate 200 are illustrated in FIG. 2A to FIG. 2E. As shown in FIG. 2A, the initial substrate 210 including the insulation layer 212 and the metal layer 214 is provided. In various embodiments of the disclosure, the initial substrate 210 may be a flexible copper clad laminate (FCCL) including liquid crystal polymers (LCPs), and the insulation layer 212 and the metal layer 214 are located on two opposite sides of the initial substrate 210 separately.

Figure 2B:
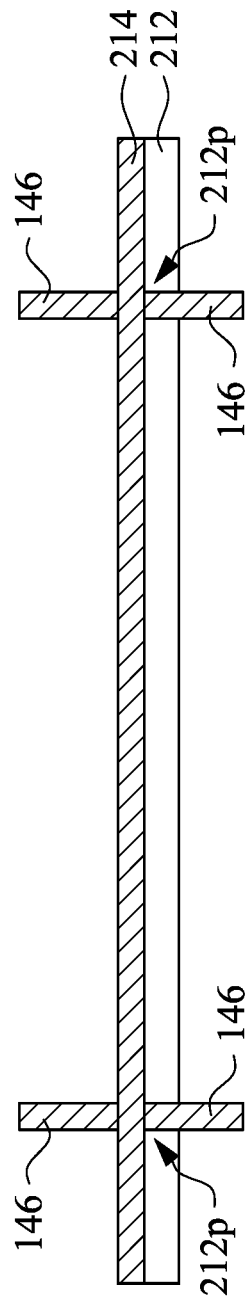

Afterwards, referring to FIG. 2B, at least two openings 212p are formed on the insulation layer 212 by such as ablative laser or similarity thereof. The metal layer 214 covers one side of each opening 212p, that is, two opposite sides of the insulation layer 212 are not connected to each other through the openings 212p. After the openings 212p are formed, one photoresist layer (not shown) is disposed on the insulation layer 212 and the metal layer 214 separately, and the photoresist layers are patterned by lithography process. As a result, a plurality of holes (not shown) which overlap the openings 212p of the insulation layer 212 are formed on the photoresist layers.

Referring to FIG. 2A and FIG. 2B, after the holes are formed on the photoresist layer, two metal materials 146 may be formed on each of two opposite sides of the initial substrate 210 by electroplating. These metal materials 146 are formed in the holes of the photoresist layers of two sides, and the holes overlap the openings 212p of the insulation layer 212. Thus, two of the metal materials 146 overlap one of the openings 212p, and the other two of the metal materials 146 overlap the other one of the openings 212p.

Figure 2C:
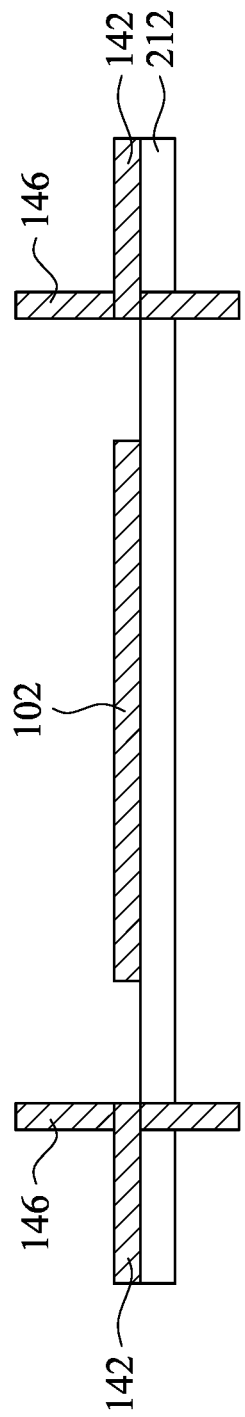

Referring to FIG. 2C, after the metal materials 146 are formed, the metal layer 214 is patterned, so that the signal wire 102 and two ground ends 142 spaced from each others are formed. The signal wire 102 is located between two ground ends 142, and the metal materials 146 are located on and electrically connected to the ground ends 142 separately. Specifically, two of the metal materials 146 are separately located on two opposite sides of one ground end 142, while the other two of the metal materials 146 are separately located on two opposite sides of the other one ground end 142.

Figure 2D:
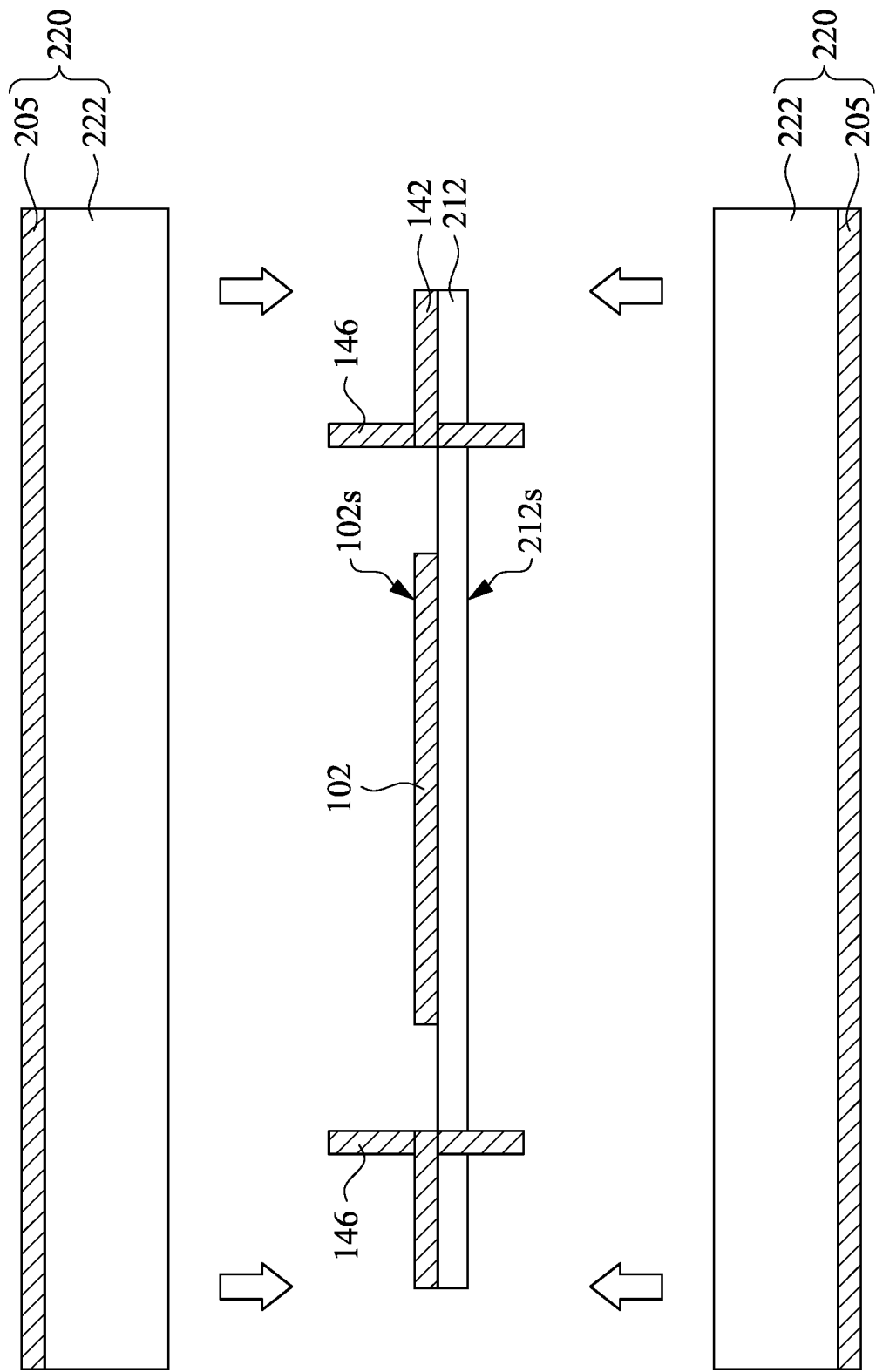

Referring to FIG. 2D, after the ground ends 142 and the signal wire 102 are formed, the insulation materials 222 are separately disposed on the insulation layer 212 and the signal wire 102, so that the substrate 200 (denoted in FIG. 2E) is formed. Specifically, one of the insulation materials 222 is disposed on the surface 212s of the insulation layer 212, while the other one of the insulation materials 222 is disposed on the surface 102s of the signal wire 102. Thus, the insulation layer 212, the ground ends 142 and the signal wire 102 are located between two insulation materials 222. The insulation materials 222 cover the signal wire 102 and the ground ends 142. In addition, the insulation materials 222 further cover the metal materials 146.

It is worth mentioning, in the embodiment, the insulation materials 222 may include materials with higher thermal plasticity, such as LCPs, PTFE, PEEK or similarity thereof. The step of separately disposing the insulation materials 222 on the insulation layer 212 and the signal wire 102 is as follows. Two FCCLs 220 including the insulation materials 222 are separately disposed on the insulation layer 212 and the signal wire 102 by hot press laminating. Afterwards, the copper foils 205 of the FCCLs 220 are removed by etching.

Figure 2E:
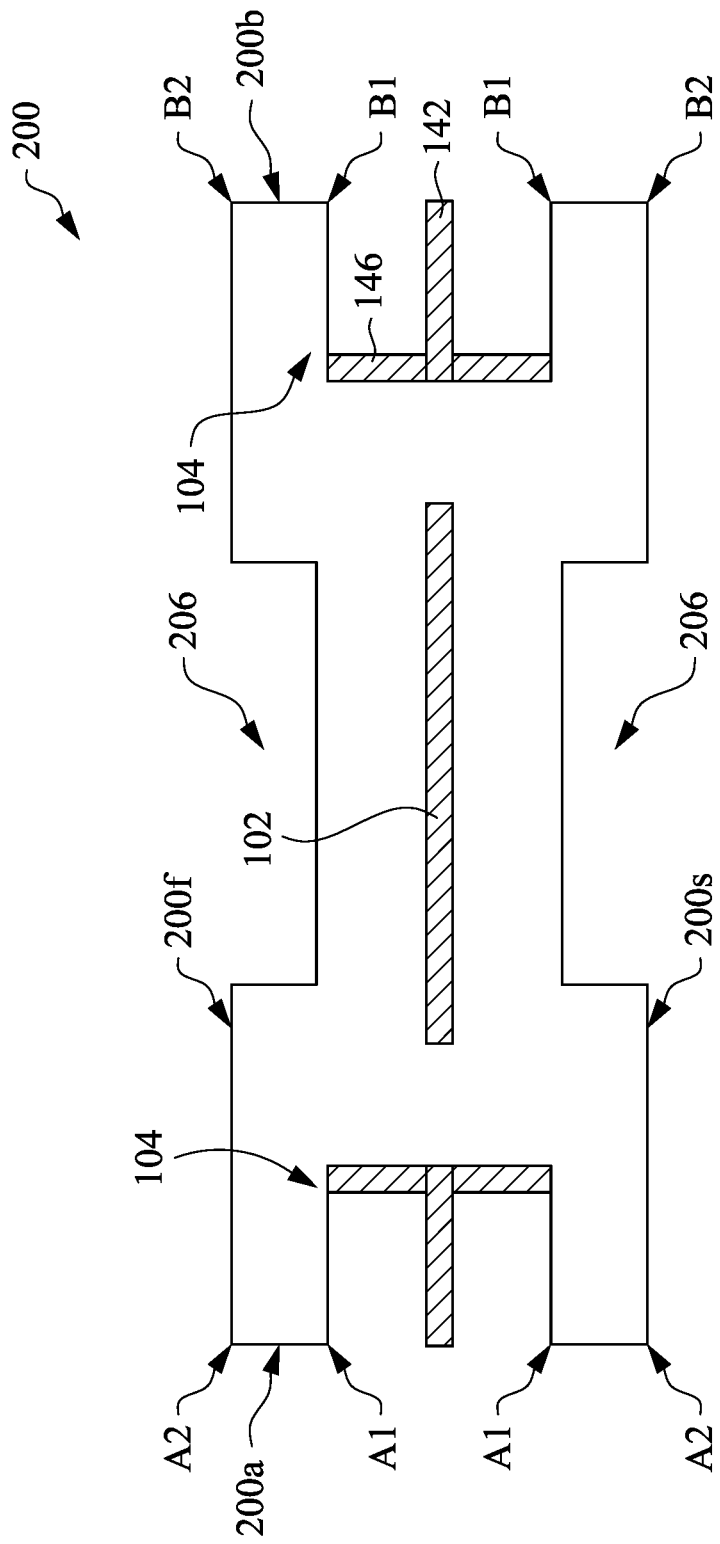

Referring to FIG. 2E, after the insulation materials 222 are separately disposed on the insulation layer 212 and the signal wire 102, a part of the substrate 200 is removed to separately form one trench 104 on end surface 200a and end surface 200b of the substrate 200 which are opposite to each other and to partially expose each of the metal materials 146 the ground ends 142. Two first boundaries A1 are located between one of the trenches 104 and the end surface 200a, while the two first boundaries B1 are located between the other one of the trenches 104 and the end surface 200b.

Afterwards, two flexible circuit substrates 120 each including the conductive layer 122 and the power layer 124 are provided, and the conductive layer 122 is electrically connected to the power layer 124. The detailed steps of providing one of the flexible circuit substrates 120 are illustrated in FIG. 3A to FIG. 3C. Firstly, as shown in FIG. 3A, the initial flexible circuit substrate 120' is provided. The initial flexible circuit substrate 120' includes the conductive layer 122 and the metal layer 324, and the conductive layer 122 and the metal layer 324 are separately located on two opposite sides of one insulation layer 126.

It is worth mentioning, the initial flexible circuit substrate 120' may be a FCCL including LCPs. That is, the materials of the conductive layer 122 and the metal layer 324 may include foil, and the materials of the insulation layer 126 may include LCPs. Furthermore, in this embodiment, the thickness of the conductive layer 122 is less than the thickness of the metal layer 324, but the disclosure is not limited to the embodiment.

Afterwards, referring to FIG. 3B, the metal bulk 324b is formed on the metal layer 324 (denoted in FIG. 3A) by electroplating. The material (i.e. metal material including copper in this embodiment) of the metal bulk 324b and the material of the metal layer 324 are the same. In other words, the metal bulk 324b may be equivalent to the thickened layer of the metal layer 324. However, the disclosure is not limited to the embodiment. In other embodiments, the metal bulk 324b may not be formed on the metal layer 324.

After the metal bulk 324b is formed, the metal layer 324 is patterned to form the flexible circuit substrates 120 including the power layers 124 by such as chemical etching. As shown in FIG. 3B, one power layer 124 includes the power supply wire 124p and two ground wires 124g, and the power supply wire 124p is located between two ground wires 124g. It is worth mentioning, the metal bulk 324b is located on the power supply wire 124p. Although the metal layer 324 is patterned after the metal bulk 324b is formed in the embodiment, the disclosure is not limited to this embodiment. In other embodiments, the metal layer 324 may be patterned before the metal bulk 324b is formed.

Accordingly, one of the flexible circuit substrates 120 is formed, and the steps of producing two flexible circuit substrates 120 of the disclosure may follow the steps above. Afterwards, referring to FIG. 3C, the covering layer 160 may be adhered on the conductive layer 122 by hot press laminating after the metal layer 324 is patterned in this embodiment. The covering layer 160 covers a part of the conductive layer 122. Furthermore, the covering layer 160 covers the power supply wire 124p and a part of each ground wire 124g.

Referring to FIG. 2E, in the embodiment, the method of producing the flexible circuit board 10 may further include removing another part of the substrate 200 to form the depressed regions 206 on the surface 200f and the surface 200s of the substrate 200 separately. Two second boundaries A2 (or two second boundaries B2) are located between the surface 200f and the surface 200s of the substrate 200 and one of the end surfaces 200a (or the end surfaces 200b). Specifically, one of the second boundaries A2 is located between one of the end surfaces 200a and the surface 200f, while the other one of the second boundaries A2 is located between these one of the end surfaces 200a and the surface 200s. One of the second boundaries B2 is located between the other one of the end surfaces 200b and the surface 200f, while the other one of the second boundaries B2 is located between this one of the end surfaces 200b and the surface 200s.

Figure 4:
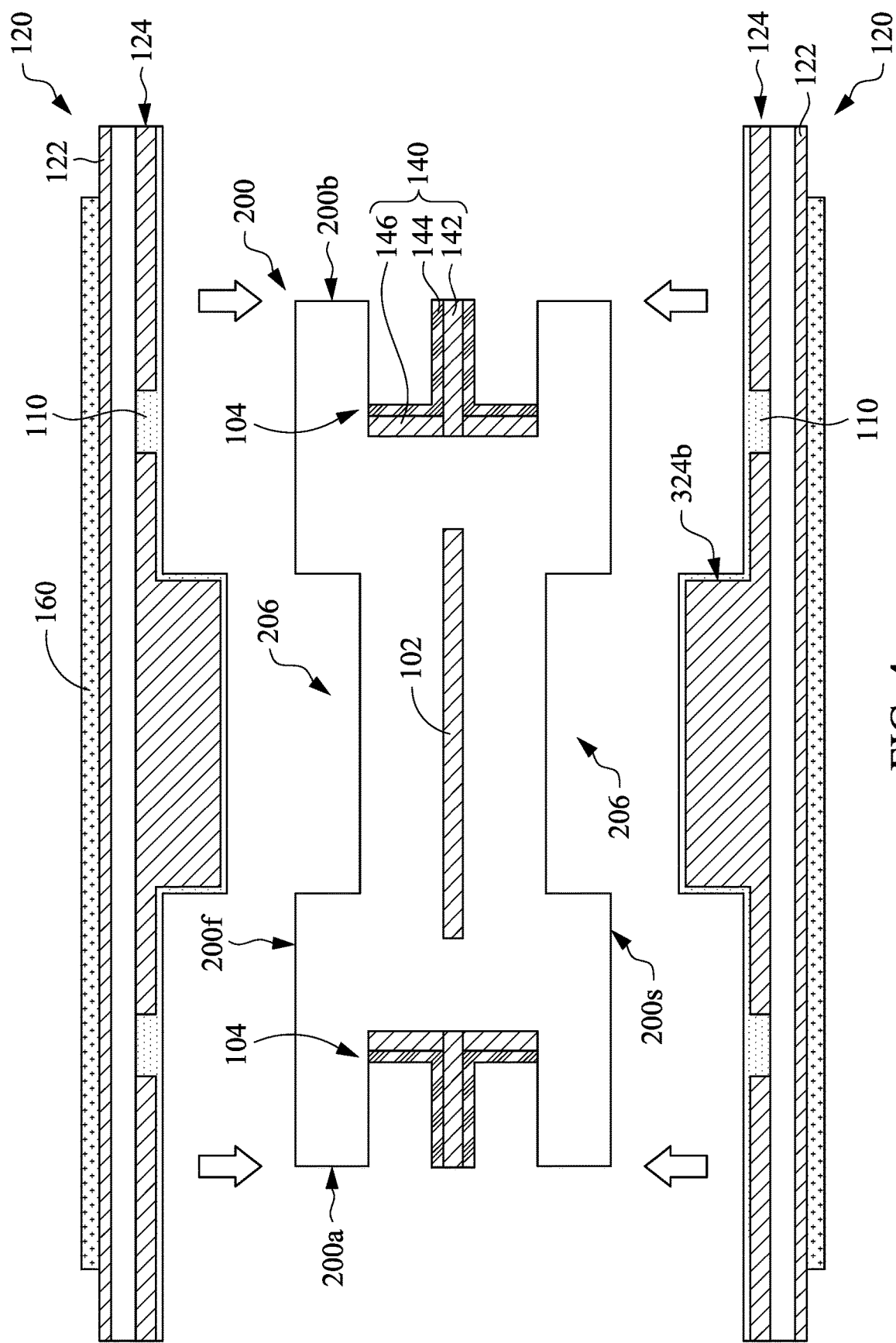
FIG. 4 illustrates cross-sectional views of a method for fabricating a flexible circuit board in accordance with one embodiment of the present disclosure.

Referring to FIG. 4, two flexible circuit substrates 120 are separately disposed on the surface 200f and the surface 200s of the substrate 200 after a part of the substrate 200 is removed, so that the power layer 124 of one of the flexible circuit substrates 120 is located between one of the conductive layers 122 and the substrate 200. That is, the power layers 124 of two flexible circuit substrates 120 both face to the substrate 200.

In the embodiment, the metal bulk metal bulk 324b of one of the flexible circuit substrates 120 is disposed on the substrate 200 and in alignment with the depressed regions 206, and the metal bulk 324b is located in the depressed regions 206 of the substrate 200. It is worth mentioning, the adhesive layers 110 covering the surfaces of the power layers 124 (and the metal bulk 324b) may be disposed on the power layers 124 of the flexible circuit substrates 120 before the flexible circuit substrates 120 are disposed on the substrate 200. After the adhesive layers 110 are disposed, the flexible circuit substrates 120 are disposed on the substrate 200 by hot press laminating.

Figure 5:
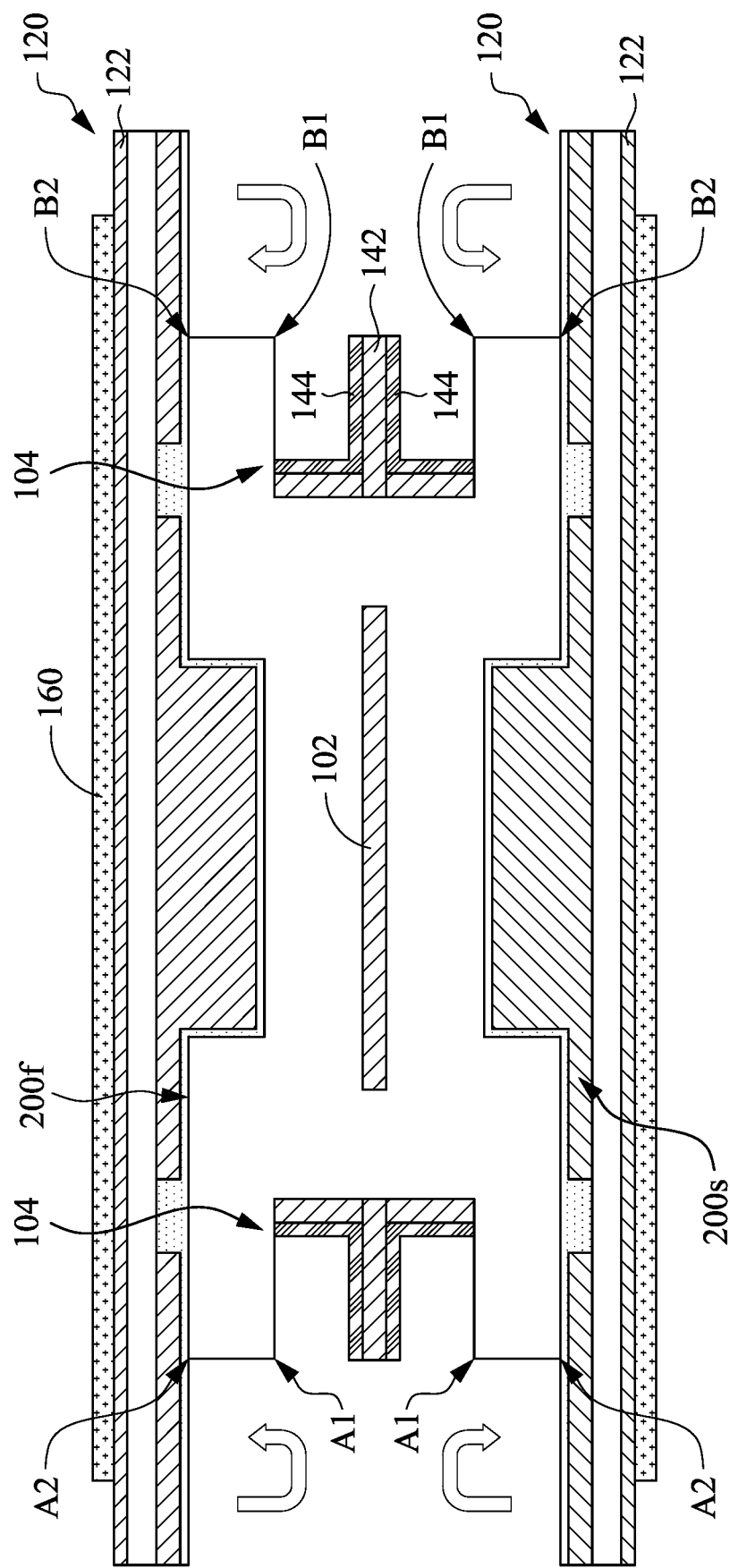
FIG. 5 illustrates cross-sectional views of a method for fabricating a flexible circuit board in accordance with one embodiment of the present disclosure.

Referring to FIG. 5, after the flexible circuit substrates 120 are disposed on the substrate 200, two opposite ends of one of the flexible circuit substrates 120 are bent separately along the second boundary A2 and second boundary B2 and bent along the first boundary A1 and the first boundary B1, so that one of the conductive layers 122 (i.e. the conductive layer 122 of one of the flexible circuit substrates 120) is connected to the other one of the conductive layers 122 (i.e. the conductive layer 122 of the other one of the flexible circuit substrates 120) within the trenches 104. On the other hand, two covering layers 160 may be connected to each other by hot press forming to form a protecting layer surrounding outside the substrate 200 and two flexible circuit substrates 120.

It is worth mentioning, two conductive layers 122 after bending are electrically connected to each other. In the embodiment, two conductive layers 122 are connected to the ground ends 142 through the soldering materials 144 separately. These soldering materials 144 may be disposed on the ground ends 142 and the metal materials 146 by such as hot-air solder leveling (HASL) before the flexible circuit substrates 120 are disposed on the substrate 200. The conductive layers 122 are bent to contact the soldering materials 144 within the trenches 104 during the hot press bending process of the flexible circuit substrates 120. Afterwards, the soldering materials 144 may be melted by the method such as laser heating, so that the conductive layers 122 are connected to the ground ends 142. Accordingly, the flexible circuit board 10 illustrated in FIG. 1 is formed.

In conclusion, the insulation layers and the insulation substrate of the flexible circuit substrates include materials with higher thermal plasticity (e.g. LCPs and modified-Polyimide). The flexible circuit substrates may be bent along the boundaries of the insulation substrate due to the thermal plasticity, so that two ends of the flexible circuit substrates may be connected to each other. As a result, the flexible circuit substrates surround outside the insulation substrate, and thus, the conductive layers of the flexible circuit substrates surround outside the insulation substrate. Since two conductive layers are electrically connected to each other, the full-shielding electromagnetic shielding layer is formed in the flexible circuit board, thereby preventing the signal wire from affecting by high frequency signal from the outside.

In addition, since the materials of the insulation layers in the flexible circuit substrates are with high thermal plasticity, the flexible circuit substrates can be adhered on the outside of the insulation substrate more closely during the hot press bending process of the flexible circuit substrates. Therefore, the air bubbles or breakages in the flexible circuit boards during the process are reduced, thereby improving the yield of the flexible circuit boards.

Although the embodiments of the present disclosure have been disclosed as above in the embodiments, they are not intended to limit the embodiments of the present disclosure. Any person having ordinary skill in the art can make various changes and modifications without departing from the spirit and the scope of the embodiments of the present disclosure.

Therefore, the protection scope of the embodiments of the present disclosure should be determined according to the scope of the appended claims.

What is claimed is:

1. A flexible circuit board, comprising:
   an insulation substrate, and each of two opposite end surfaces of the insulation substrate has a trench;
   a signal wire, disposed in the insulation substrate, and the insulation substrate surrounds the signal wire;
   two flexible circuit substrates, separately located on two surfaces of the insulation substrate opposite to each other, wherein each of the flexible circuit substrates comprises:
      a conductive layer, extending from one of the surfaces of the insulation substrate toward the end surfaces of the insulation substrate and extending into the trenches along the end surfaces of the insulation substrate; and
      a power layer, located between the conductive layer and the insulation substrate and is electrically connected to the conductive layer;
   wherein one of the conductive layers is connected to the other one of the conductive layers within the trenches, and the conductive layers are electrically connected to each other.

2. The flexible circuit board of claim 1, further comprising:
   two conductive structures, located inside the trenches separately, and one of the conductive layers is connected to the other one of the conductive layers through the conductive structures.

3. The flexible circuit board of claim 2, wherein each of the conductive structures comprising:
   a ground end; and
   two soldering materials, located on two opposite sides of the ground end separately, wherein the conductive layers are electrically connected to the ground end separately through the soldering materials, and the power layers are electrically connected to the ground end separately through the soldering materials.

4. The flexible circuit board of claim 3, wherein each of the conductive structures further comprising:
   two metal materials, located on the two opposite sides of the ground end separately and located on a bottom surface of the trench, wherein the conductive layers are electrically connected to the ground ends through the soldering materials and the metal materials.

5. The flexible circuit board of claim 2, wherein each of the power layers comprising:
   two ground wires, and each of the ground wires is partially located into one of the trenches and is connected to one of the conductive structures separately; and
   a power supply wire, located between the ground wires and is electrically connected to the ground wires.

6. The flexible circuit board of claim 1, wherein each of the flexible circuit substrates further comprising:
   an insulation layer, wherein the conductive layer and the power layer are located on two opposite sides of the insulation layer separately, and a thickness of the power layer is larger than a thickness of the conductive layer.

7. The flexible circuit board of claim 1, wherein the insulation substrate comprises liquid crystal polymers.

8. The flexible circuit board of claim 1, further comprising:
   a covering layer, disposed on the conductive layers of the flexible circuit substrates and surrounding the insulation substrate and the flexible circuit substrates.

9. The flexible circuit board of claim 1, further comprising:
   two adhesive layers, separately located between the flexible circuit substrates and the insulation substrate.

10. A method for fabricating a flexible circuit board, comprising:
    providing a substrate with a signal wire and two ground ends, and the signal wire is located between the ground ends;
    removing a part of the substrate to form a trench on each of two opposite end surfaces of the substrate and to partially expose the ground ends, and two first boundaries are located between one of the trenches and one of the end surfaces;
    providing two flexible circuit substrates, and each of the flexible circuit substrates includes a conductive layer and a power layer electrically connected to each other;
    disposing the flexible circuit substrates on two opposite surfaces of the substrate separately after the part of the substrate is removed, and one of the power layers is located between one of the conductive layers and the substrate, wherein two second boundaries are located between the surfaces of the substrate and one of the end surfaces; and
    bending two opposite ends of one of the flexible circuit substrates separately along the second boundaries and along the first boundaries after the flexible circuit substrates are disposed on the substrate, so that one of the conductive layers is connected to the other one of the conductive layers within the trenches, and the conductive layers are electrically connected to each other.

11. The method of claim 10, wherein providing the substrate comprising:
    providing an initial substrate including an insulation layer and a metal layer located on two opposite sides of the initial substrate separately;
    forming two metal materials on each of the opposite sides of the initial substrate separately;
    patterning the metal layer to form the signal wire and the ground ends spaced from each other, and each of the metal materials is separately located on and electrically connected to the ground ends; and
    disposing each of two insulation materials separately on the insulation layer and on the signal wire to form the substrate after the ground ends and the signal wire are formed, wherein the insulation layer, the ground ends and the signal wire are located between the two insulation materials, and the insulation materials cover the signal wire and the ground ends.

12. The method of claim 10, wherein providing one of the flexible circuit substrates comprising:
    providing an initial flexible circuit substrate including one of the conductive layers and a metal layer, wherein a thickness of the one of the conductive layers is less than a thickness of the metal layer;
    forming a metal bulk on the one of the conductive layers; and
    patterning the one of the conductive layers to form the flexible circuit substrate including the one of the power layers;
    wherein the one of the power layers includes a power supply wire and two ground wires, and the power supply wire is located between the two ground wires, wherein the metal bulk is located on the power supply wire.

13. The method of claim 12, further comprising:

removing another part of the substrate to form a depressed region on each of the surfaces of the substrate separately; and disposing the metal bulk of one of the flexible circuit substrates on the substrate and in alignment with the depressed region.

14. The method of claim 12, wherein providing the one of the flexible circuit substrates further comprising:

adhering a covering layer on the conductive layers after the metal layer is patterned, wherein the covering layer covers the power supply wire and a part of the ground wires.

15. The method of claim 10, further comprising:

disposing two adhesive layers on two of the power layers separately before the flexible circuit substrates are disposed on the substrate, wherein the adhesive layers cover two surfaces of the power layers.

* * * * *